United States Patent
Paik et al.

(10) Patent No.: US 9,267,826 B2
(45) Date of Patent: Feb. 23, 2016

(54) SYSTEM FOR SELF-POWERED, WIRELESS MONITORING OF ELECTRICAL CURRENT, POWER AND ENERGY

(75) Inventors: Namwook Paik, Acton, MA (US); Vishwas Mohaniraj Deokar, Acton, MA (US); James H. Donalds, Lunenburg, MA (US)

(73) Assignee: SCHNEIDER ELECTRIC IT CORPORATION, West Kingston, RI (US)

( * ) Notice: Subject to any disclaimer, the term of this patent is extended or adjusted under 35 U.S.C. 154(b) by 1034 days.

(21) Appl. No.: 12/789,922

(22) Filed: May 28, 2010

(65) Prior Publication Data
US 2011/0291488 A1 Dec. 1, 2011

(51) Int. Cl.
| | |
|---|---|
| H02J 17/00 | (2006.01) |
| H05K 5/00 | (2006.01) |
| H02M 7/00 | (2006.01) |
| G01D 21/00 | (2006.01) |
| H02J 3/00 | (2006.01) |
| G01R 15/18 | (2006.01) |
| H01F 27/42 | (2006.01) |
| G01R 15/26 | (2006.01) |

(52) U.S. Cl.
CPC ............. G01D 21/00 (2013.01); G01R 15/183 (2013.01); H02J 3/00 (2013.01); G01R 15/26 (2013.01); H01F 27/427 (2013.01); Y04S 20/00 (2013.01)

(58) Field of Classification Search
CPC . G06F 17/5036; H01F 27/425; H01F 27/427; G01R 19/0092; G01R 19/165; G01R 19/22
See application file for complete search history.

(56) References Cited

U.S. PATENT DOCUMENTS

| | | | |
|---|---|---|---|
| 5,959,818 | A | 9/1999 | Blakely |
| 7,412,338 | B2 * | 8/2008 | Wynans et al. ................ 702/61 |
| 2004/0075343 | A1 | 4/2004 | Wareham et al. |
| 2010/0264906 | A1 | 10/2010 | Shamir et al. |

FOREIGN PATENT DOCUMENTS

| | | |
|---|---|---|
| EP | 1 703 289 A1 | 9/2006 |
| EP | 2 354 799 A1 | 8/2011 |
| GB | 2 241 396 A | 8/1991 |

OTHER PUBLICATIONS

Mars, Using a supercapacitor to manage yor power, Energy Harvesting Journal, Dec. 14, 2009, pp. 1-11.*
International Search Report for PCT/US2011/038087 dated Nov. 10, 2011.

* cited by examiner

Primary Examiner — Janet Suglo
Assistant Examiner — Lynne Anderson
(74) Attorney, Agent, or Firm — Lando & Anastasi LLP

(57) ABSTRACT

According to one aspect, embodiments of the invention provide a system for monitoring at least one circuit branch coupled to a power line, the system comprising at least one first module comprising a Current Transformer (CT) configured to be coupled to the at least one circuit branch and to produce a reference signal having a level related to a current level of the at least one circuit branch, a rectifier coupled to the CT and configured to produce a rectified reference signal, a capacitor coupled to the rectifier, and a first microcontroller coupled to the capacitor and the rectifier, wherein, the capacitor is configured to store energy from the rectified reference signal, and wherein, the first microcontroller is configured to be powered by the energy stored in the capacitor and to sample the rectified reference signal to determine the current level of the at least one circuit branch.

19 Claims, 5 Drawing Sheets

SYSTEM FOR SELF-POWERED, WIRELESS MONITORING OF ELECTRICAL CURRENT, POWER AND ENERGY

BACKGROUND OF THE INVENTION

1. Field of the Invention

At least one example in accordance with the present invention relates generally to systems and methods for monitoring a load center for current and power usage.

2. Discussion of Related Art

A load center or panelboard is a component of an electrical supply system which divides an electrical power feed from a power line into different subsidiary circuit branches. Each subsidiary circuit branch may be connected to a different load. Thus, by dividing the electrical power feed into subsidiary circuit branches, the load center may allow a user to individually control and monitor the current and power usage of each load.

Current Transformers (CT) are commonly used to monitor current in a subsidiary or main branch of a load center. A CT may be used to measure current in a branch by producing a reduced current signal, proportionate to the current in the branch, which may be further manipulated and measured. For example, a CT coupled to a branch of a load center may produce a reduced current AC signal, proportionate to the magnitude of AC current in the branch. The reduced current AC signal may then either be measured directly by measurement instrument or converted to a DC signal and passed to a measurement instrument. Based on the signal received, the measurement instrument may determine the level of current in the subsidiary branch and may assist in providing efficient energy management.

BRIEF SUMMARY OF THE INVENTION

Aspects in accord with the present invention are directed to a system and method for monitoring a load center for current and power usage In one aspect the present invention features a system for monitoring at least one circuit branch coupled to a power line. The system may comprise at least one first module comprising a Current Transformer (CT) configured to be coupled to the at least one circuit branch and to produce a reference signal having a level related to a current level of the at least one circuit branch, a rectifier coupled to the CT and configured to produce a rectified reference signal, a capacitor coupled to the rectifier, and a first microcontroller coupled to the capacitor and the rectifier, wherein, the capacitor is configured to store energy from the rectified reference signal, and wherein, the first microcontroller is configured to be powered by the energy stored in the capacitor and to sample the rectified reference signal to determine the current level of the at least one circuit branch.

According to one embodiment, the system may further comprise a second module comprising a first input configured to be coupled to a circuit branch, and a second microcontroller coupled to the first input and configured to measure at least one of voltage, phase and frequency of the circuit branch and transmit the at least one of the voltage, the phase and the frequency to the first microcontroller. In one embodiment, the second module is contained in a separate housing from the at least one first module.

According to another embodiment, the first microcontroller is configured to receive the at least one of the voltage, the phase, and the frequency, and calculate power level of the at least one circuit branch using at least one sample of the rectified reference signal and the received at least one of the voltage, the phase and the frequency.

According to one embodiment, the system may further comprise a first antenna coupled to the first microcontroller and a second antenna coupled to the second microcontroller, and wherein the second antenna is configured to broadcast the at least one of the voltage, the phase and the frequency of the circuit branch to the first antenna. In another embodiment, the first antenna is configured to broadcast the calculated power level and the current level of the at least one circuit branch to the second antenna.

According to another embodiment, the at least one first module includes a plurality of daisy chained first modules, each having a capacitor and each configured to be coupled to a circuit branch. In one embodiment, the capacitors of the plurality of first modules are coupled together.

In another aspect, the present invention features a method for monitoring at least one circuit branch coupled to a power line. The method may comprise coupling a Current Transformer (CT) to the at least one circuit branch and producing, in a first module, a reference signal having a level related to a current level of the at least one circuit branch, storing energy from the reference signal in a capacitor, determining if voltage across the capacitor exceeds a first threshold, in response to a determination that the voltage across the capacitor exceeds the first threshold, powering a microcontroller using energy stored in the capacitor, and sampling the reference signal by the microcontroller to determine the current level of the at least one circuit branch.

According to one embodiment, the method may further comprise monitoring, by a second module coupled to the power line, at least one of voltage, phase and frequency of the power line, and transmitting the at least one of the voltage, the phase and the frequency to the microcontroller. In one embodiment, the act of transmitting includes transmitting the at least one of the voltage, the phase and the frequency through an antenna.

According to another embodiment, the method may further comprise receiving, by the first module, the at least one of the voltage, the phase, and the frequency transmitted by the second module and calculating power level of the at least one circuit branch using at least one sample of the reference signal and the received at least one of the voltage, the phase and the frequency. In one embodiment, the method may further comprise transmitting the calculated power level of the at least one circuit branch from the first module to the second module through an antenna.

According to one embodiment, the method may further comprise determining if voltage across the capacitor is less than a second threshold, and entering, in response to a determination that the voltage across the capacitor is less than the second threshold, a low power mode. In one embodiment, entering a low power mode comprises periodically transmitting, from the first module to the second module, a series of pulses, wherein an interval between pulses is based on the current level of the at least one circuit branch, and measuring, by the second module, the interval between pulses and estimating the current of the at least one circuit branch.

In another aspect, the present invention features a system for monitoring at least one circuit branch coupled to a power line. The system may comprise at least one first module comprising a Current Transformer (CT) configured to be coupled to the at least one circuit branch and to produce a reference signal having a level related to a current level of the at least one circuit branch, and means for storing energy from the reference signal and for powering a microcontroller to sample the reference signal to determine the current level of the at least one circuit branch.

According to one embodiment, the system may further comprise a second module comprising means for measuring at least one of voltage, phase and frequency of the power line and for transmitting the at least one of the voltage, the phase and the frequency to the microcontroller. In one embodiment, the second module is contained in a separate housing from the at least one first module.

According to another embodiment, the system may further comprise means for receiving, by the first module, at least one of the voltage, the phase, and the frequency transmitted by the second module, for calculating the power level of the at least one circuit branch using at least one sample of the rectified reference signal and the received at least one of the voltage, the phase and the frequency, and for transmitting the calculated power level and the current level of the at least one circuit branch to the second module.

According to one embodiment, the at least one first module includes a plurality of daisy chained first modules, each having means for storing energy and each configured to be coupled to a circuit branch.

BRIEF DESCRIPTION OF THE DRAWINGS

The accompanying drawings are not intended to be drawn to scale. In the drawings, each identical or nearly identical component that is illustrated in various FIGS. is represented by a like numeral. For purposes of clarity, not every component may be labeled in every drawing. In the drawings.

DETAILED DESCRIPTION OF THE INVENTION

Figure 1:
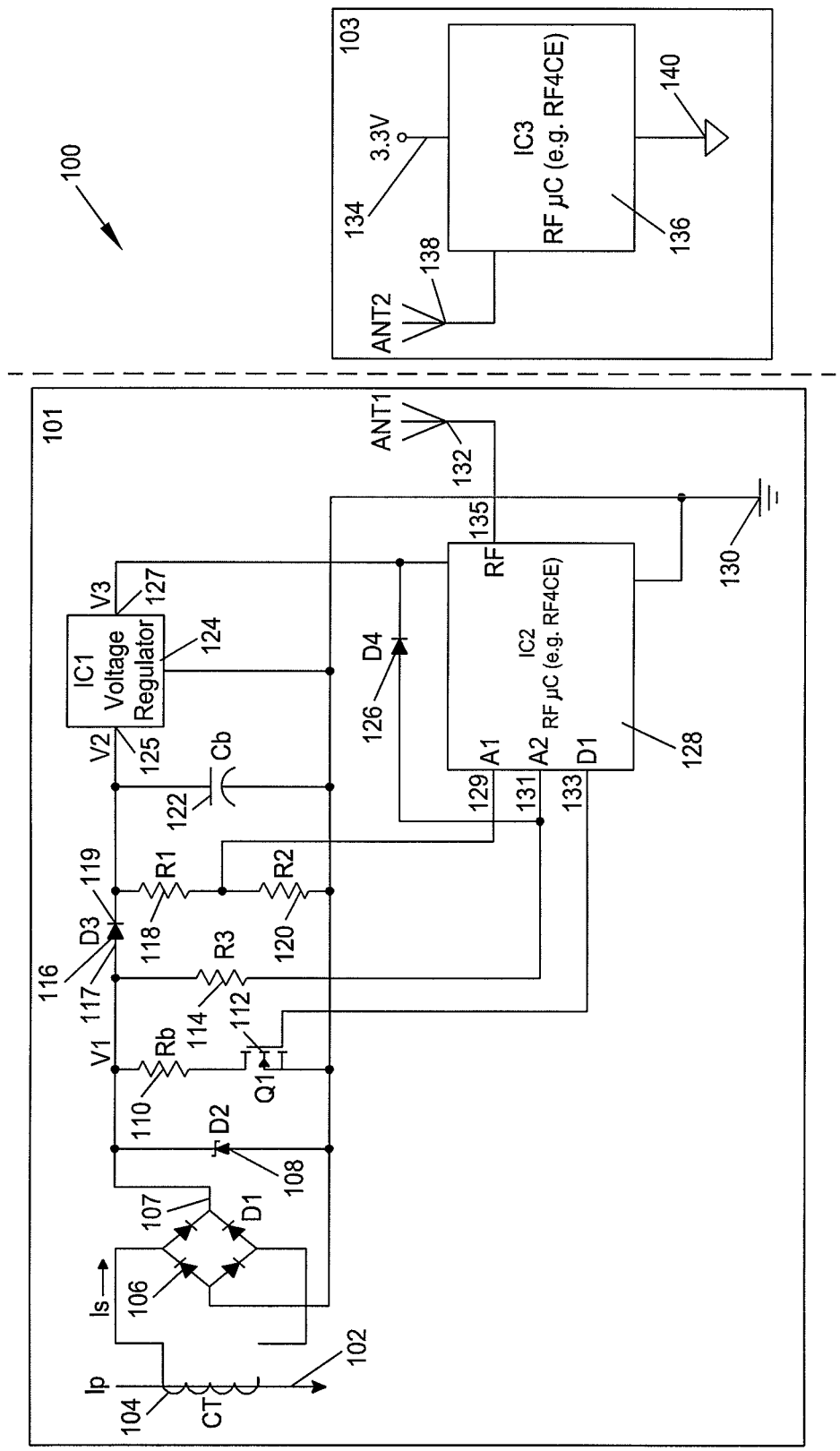
FIG. 1 is a circuit diagram of one example of a CT based system in accordance with aspects of the present invention.

Embodiments of the invention are not limited to the details of construction and the arrangement of components set forth in the following description or illustrated in the drawings. Embodiments of the invention are capable of being practiced or of being carried out in various ways. Also, the phraseology and terminology used herein is for the purpose of description and should not be regarded as limiting. The use of "including," "comprising," or "having," "containing", "involving", and variations thereof herein, is meant to encompass the items listed thereafter and equivalents thereof as well as additional items.

As discussed above, CT's may be utilized with a load center of an electrical supply system to monitor circuit branches and assist in providing efficient energy management. For instance, CT's may be coupled to circuit branches inside or outside of a load center. However, multiple challenges with CT's may arise as the electrical supply system grows in size and complexity.

For example, the circuitry of a load center with a large number of subsidiary branches may be complex and difficult to manage. It may even be difficult to physically place all of the desired CT's and corresponding circuitry within the load center. For instance, problems may arise in placing all of the necessary CT circuitry, wiring and power supply circuitry within the load center, while maintaining a configuration that is operative and complies with applicable safety codes and government regulations for load centers. Also, due to the complexity of such a load center; installation, expansion and maintenance may also be difficult and even hazardous.

At least some embodiments described herein overcome these problems and provide a relatively small, less complex and more manageable method and system for utilizing CT's to monitor circuit branches of a load center.

FIG. 1 shows a CT based system 100 for monitoring a subsidiary circuit branch 102 of a load center according to one embodiment of the current invention. The system 100 includes a CT module 101 and a communication module 103. The CT module 101 includes a CT 104, a rectifier 106 having an output 107, a Zener diode 108, a burden resistor 110, a transistor 112, a first resistor 114, a first diode 116 having a cathode 119 and an anode 117, a second resistor 118, a third resistor 120, a capacitor 122, a voltage regulator 124 having an input 125 and an output 127, a second diode 126, a microcontroller 128, a ground connection 130 and an antenna 132. According to one embodiment, the microcontroller 128 includes a first input 129, a second input 131, a control line 133 and a transmission line 135. According to one embodiment the antenna 132 is an RF antenna. Also, in one embodiment, the communication module 103 includes a microcontroller 136, an antenna 138 and a ground line 140.

According to one embodiment, in the CT module 101, the CT 104 is electrically coupled to a subsidiary circuit branch 102 of a load center. The rectifier 106 is coupled to the CT 104 and to the ground connection 130. The Zener diode 108 is coupled between the output 107 of the rectifier 106 and the ground connection 130. The burden resistor 110 is coupled between the output 107 of the rectifier 106 and the transistor 112. The transistor 112 is selectively coupled between the burden resistor 110 and the ground connection 130. The control line 133 of the microcontroller 128 is coupled to the transistor 112. The first resistor 114 is coupled between the output 107 of the rectifier 106 and the second input 131 of the microcontroller 128. The anode 117 of the first diode 116 is coupled to the output 107 of the rectifier 106. The cathode 119 of the first diode 116 is coupled to the input 125 of the voltage regulator 124. The second resistor 118 is coupled between the cathode 119 of the first diode 116 and the third resistor 120. The third resistor 120 is coupled between the second resistor 118 and the ground connection 130. The first input 129 of the microcontroller 128 is coupled between the second resistor 118 and the third resistor 120. The capacitor 122 is coupled between the input 125 of the voltage regulator 124 and the ground connection 130. The output 127 of the voltage regulator 124 is coupled to the microcontroller 128. The second diode 126 is coupled between the second input 131 of the microcontroller 128 and the output 127 of the voltage regulator. The antenna 132 is coupled to the transmission line 135 of the microcontroller 128.

According to one embodiment, in the communication module 103, the microcontroller 136 is coupled to a circuit branch 134. It should be appreciated that even though the microcontroller 135 is described herein as coupled to a circuit branch 134, the microcontroller 135 may be coupled to and powered by a battery (not shown). The antenna 136 and ground connection 140 are coupled to the microcontroller 136.

In one embodiment, the CT module 101 is located within a load center (not shown) while the communication module 103 is located externally from the load center. For example, according to one embodiment where the load center is part of a residential energy management system and is coupled to a main power line of the residence, the CT module 101 may be located within the load center or panelboard of the residence, coupled to a circuit branch of the load center, while the communication module 103 is located somewhere else in the residence, coupled to a circuit branch. It should be appreciated that even though the CT module 101 is described herein as coupled to a circuit branch within the load center, the CT module 101 may be coupled to a circuit branch outside of the load center. It also should be appreciated that even though the system 100 is described herein in relation to a residential energy management system, the system 100 may be utilized with any type of energy management system.

According to one embodiment, the microcontroller 136 of the communication module 103 receives power from the main power line (not shown) of the residence via the circuit branch 134. The microcontroller 136 may calculate voltage, phase and frequency information of the power line and wirelessly broadcast the information to the CT module 101 via the antenna 136. The microcontroller 136 may broadcast the voltage, phase and frequency information to the CT module 101 periodically or at any other desired time. According to one embodiment, communication between the CT module 101 and the communication module 103 may be performed in compliance with a wireless standard such as the ZigBee RF4CE standard. In another embodiment, communication between the CT module 101 and the communication module 103 may be performed in compliance with the IEEE 802.15 standard. It should be appreciated that even though communication between the CT module 101 and the communication module 103 is described herein as through a wireless medium, the communication between modules 101, 103 may be accomplished via a wired interface.

According to one embodiment, the CT module 101 is capable of operating in two modes: an energy harvesting mode and a current measurement mode. In one embodiment, while in the energy harvesting mode, AC power from the main power line of the residence (not shown) is provided to the subsidiary circuit branch 102 and consequently induces a proportionate AC current in the CT 104. The AC current in the CT 104 is converted by the rectifier 106 to DC current and the DC current is stored in the capacitor 122, via the forward-biased first diode 116.

While energy is being stored in the capacitor 122, the voltage regulator 124 monitors the voltage level across in the capacitor 122. When the voltage across the capacitor 122 is at a sufficient level, the voltage regulator 124 supplies power to the microcontroller 128 to power on the microcontroller 128. Once powered on, the microcontroller 128 enters a standby mode.

Once in standby mode, the microcontroller 128 continues to monitor the voltage across the capacitor 122 by monitoring the voltage level between the second resistor 118 and the third resistor 120 via the first input 129. When the voltage across the capacitor 122 reaches a sufficient level, the CT module 101 will enter the current measurement mode.

In the current measurement mode, the microcontroller 128 enters an active mode. The microcontroller 128 sends a signal, via the control line 133, to the transistor 112 to power on the transistor and couple the burden resistor 110 to the ground connection 130. Once the burden resistor is coupled to the ground connection 130, the first diode 116 becomes reverse biased, preventing current between the rectifier 106 and the voltage regulator 124. Instead, the microcontroller 128, powered by energy from the capacitor 122 via the voltage regulator 124, samples the current from the rectifier 106 to the second input 131 via the first resistor 114.

In one embodiment, the microcontroller 128 is configured to sample the current periodically. In another embodiment, the microcontroller 128 is configured to sample the current upon request.

Upon taking a sufficient number of current samples, the microcontroller 128 enters a transmit/receive mode. Once in transmit/receive mode, the microcontroller 128 activates the antenna 132 and begins to receive the voltage, phase and frequency information from the communication module 103 via the antenna 132 and transmission line 135. It should be appreciated that because the CT module 101 and the communication module 103 both receive power from circuit branches coupled to the main power line, the voltage, phase and frequency of the signals received by the microcontroller 135 of the communication module 103 via the circuit branch 134 will be relatively the same as the voltage, phase and frequency of the circuit branch 102 coupled to the CT module 101. Hence, by calculating the voltage, phase and frequency information of the signals received by the microcontroller 135 of the communication module 103, the voltage, phase and frequency information of the circuit branch 102 may be determined.

According to one embodiment, the microcontroller 128 may calculate additional information about the circuit branch 102 (i.e. true power, power factor and RMS current) using the current sample and the voltage, phase and frequency information received from the communication module 103. For example, in one embodiment, the microcontroller 128 uses the phase information received from the communication module 103 to "timestamp" the current samples so that accurate true power, power factor and RMS current in the circuit branch 102 can be calculated.

In one embodiment, the microcontroller 128 may convert the current samples and/or additional power information into digital data. Also, according to another embodiment, in transmit/receive mode, the current and power information may be transmitted, via the transmission line 135 and the antenna 132 to the communication module 103 or to some other energy management system.

It should be appreciated that in at least one embodiment, the microcontroller 128 is a low power controller (i.e. a microwatt controller) capable of sampling a low current and being powered by low power. For example, if the CT module 101 is coupled to a circuit branch 102 requiring a relatively low power (i.e. a cell phone charger requiring 1 watt), the current in the branch 102, and consequently the CT module 101, will be low. As a result, the amount of energy stored in the capacitor 122 will also be low. Thus a controller capable of sampling a low current in the CT module 101 while being adequately powered by low power from the capacitor 122 may be required.

It should be appreciated that even though the communication module 103 is described herein as external from the load center, the communication module 103 may be located within the same load center as the CT module 101. In such a situation where the communication and CT modules 101, 103 are located within the same load center, the need to self-power the CT module 101 may be eliminated as the power received by the communication module 103 via the circuit branch 134 can directly power the entire system 100.

It also should be appreciated that by eliminating the need for an internal power supply within the self-powered CT system and allowing the wireless bi-directional exchange of information between the CT module and the external communication module, the size and complexity of the self-powered, wireless CT system may be reduced. Additionally, because there is no need to directly tap into the voltage within the load center, regulatory requirements of the load center may be more easily satisfied.

Figure 2:
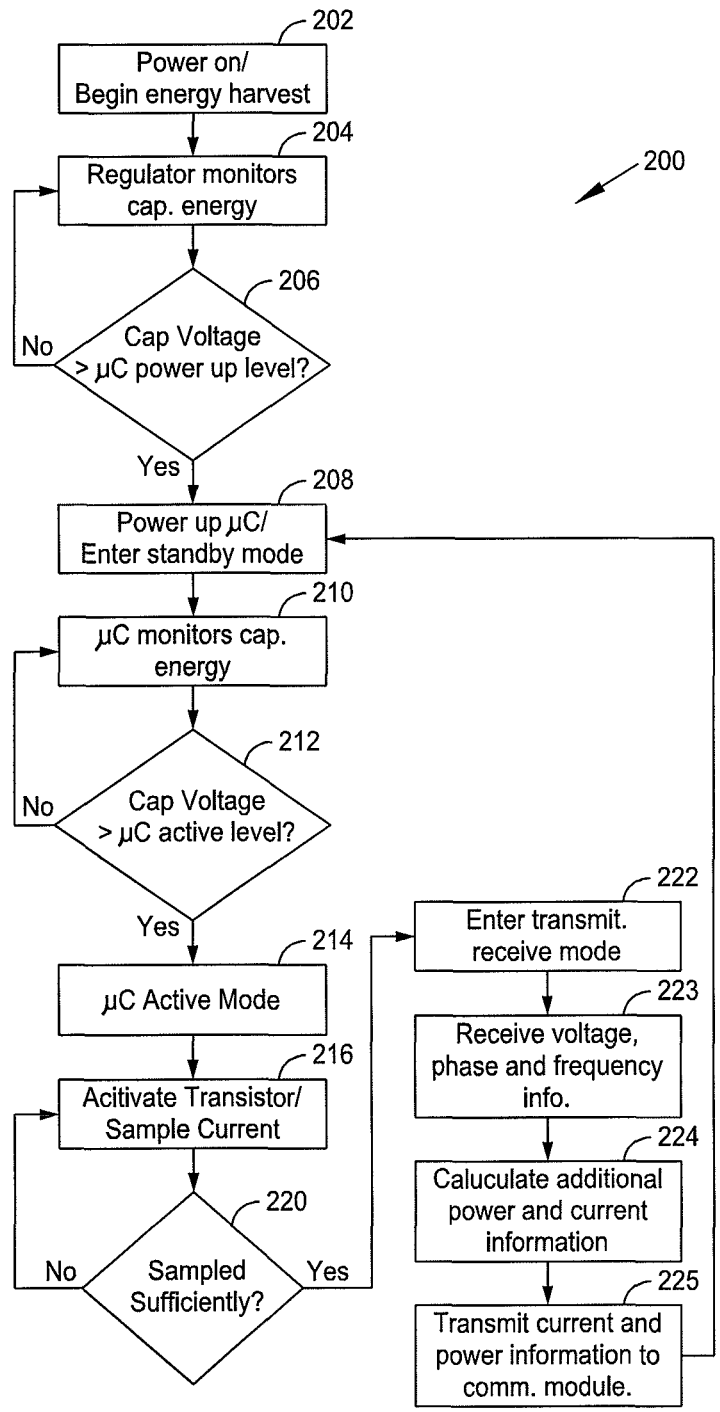
FIG. 2 is a flow chart illustrating one example of a method of operation of the CT based system of FIG. 1, in accordance with aspects of the present invention.

FIG. 2 illustrates one embodiment of a method 200 of operation of the CT module 101 illustrated in FIG. 1. At block 202, power is supplied to the CT module 101 and the CT module 101 enters energy harvest mode.

At block 204, the voltage regulator 124 monitors the voltage across the capacitor 122. At block 206, a determination is made whether the voltage across the capacitor 122 is greater than a minimum level required to power on the microcontroller 128 into standby mode. In response to a determination that the voltage across the capacitor 122 is less than the minimum level required to power on the microcontroller 128, the voltage regulator 124 continues to monitor the level of energy stored in the capacitor 122. At block 208, in response to a determination that the voltage across the capacitor 122 is greater than the minimum level required to power on the microcontroller 128, the microcontroller 128 is powered on into standby mode.

At block 210, the microcontroller 128 monitors the voltage across the capacitor 122 via the voltage divider which includes the second and third resistors 118, 120. At block 212, a determination is made whether the voltage across the capacitor 122 is greater than a minimum level required to put the microcontroller 128 into an active mode. In response to a determination that the voltage across the capacitor 122 is less than the minimum level required to put the microcontroller 128 into an active mode, the microcontroller 128 continues to monitor the voltage across the capacitor 122. At block 214, in response to a determination that the voltage across the capacitor 122 is greater than the minimum level required to put the microcontroller 128 into an active mode, the microcontroller 128 enters the active mode.

At block 216, the microcontroller 128 activates the transistor 112 and samples the current from the rectifier 106 to the second input 131 via the first resistor 114. The microcontroller 128 may be configured to sample the current periodically or specifically upon request.

At block 220, a determination is made whether a sufficient number of current samples have been taken. The number of samples deemed sufficient may be predetermined by a user. In response to a determination that an insufficient number of samples have been taken, the microcontroller 128 continues to sample the current in the CT module 101. At block 222, in response to a determination that a sufficient number of current sample have been taken, the microcontroller 128 enters a transmit/receive mode.

At block 223, the microcontroller 128 activates the antenna 132 and receives voltage, phase and frequency information from the external communication module 103. At block 224, using the sampled current and the voltage, phase and frequency information received from the communication module, the microcontroller 128 calculates additional power and current information such as true power, power factor and RMS current.

At block 225, the microcontroller 128 transmits current and power information to the communication module 103 or to some other energy management system. After transmitting the current and power information, the microcontroller 128 reenters standby mode.

Figure 3:
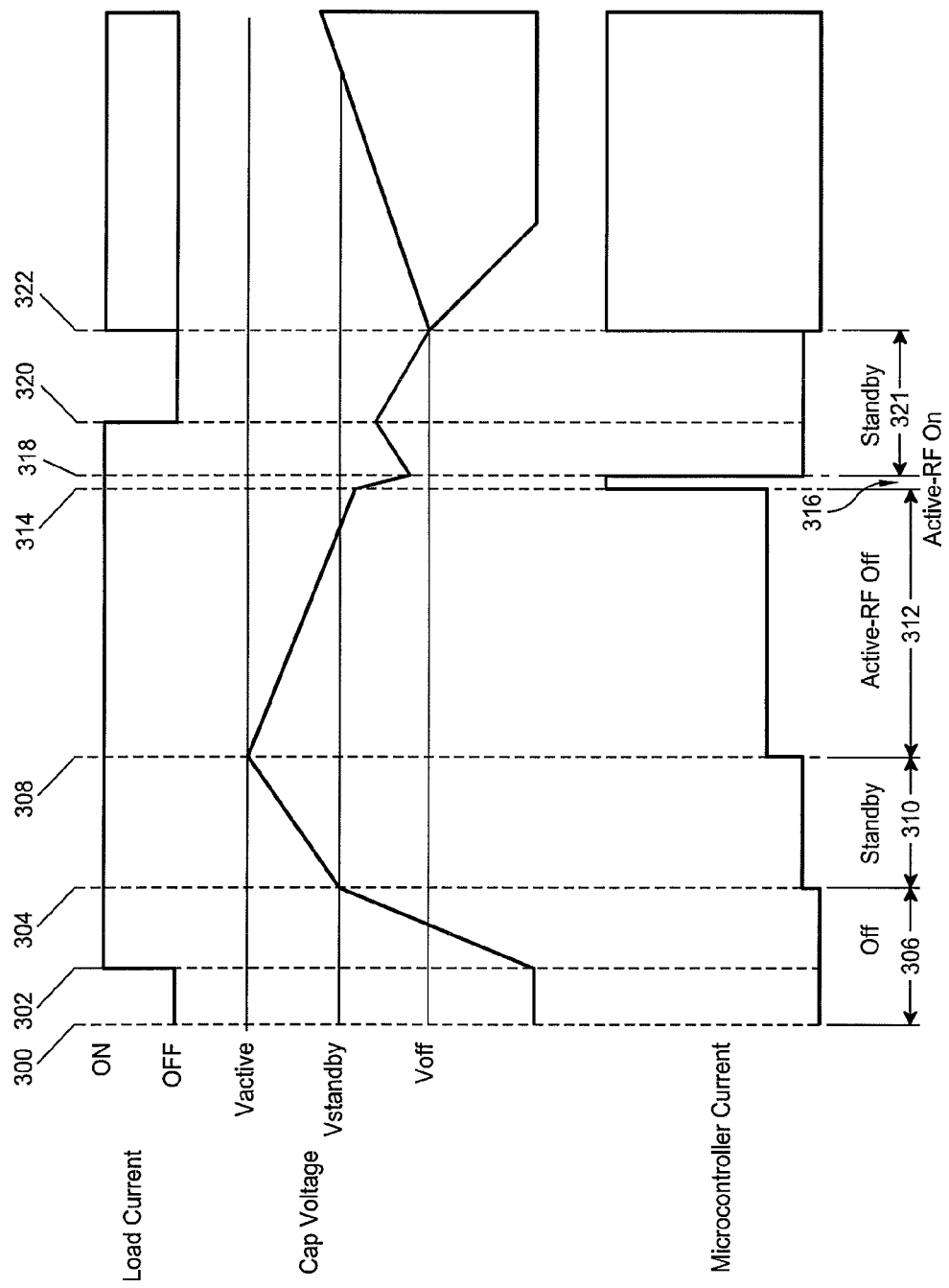
FIG. 3 is a diagram illustrating one example of the operation of the CT based system of FIG. 1, in accordance with aspects of the present invention.

FIG. 3 is a diagram representing the operation of the CT module 101 illustrated in FIG. 1. In FIG. 3, the load current, capacitor voltage and microcontroller current over time are represented.

At time 300, a load coupled to a circuit branch 102 of a load center is not powered. At time 302, the load is powered on and current begins to pass from the circuit branch 102 to the load and also consequently the CT module 101. Also at time 302, once the load is powered and the CT module 101 enters energy harvest mode, the voltage across the capacitor 122 begins to increase. From time 302 to time 304, the voltage across the capacitor 122 (representing the amount of energy harvested) will increase until it reaches a standby level at time 304. Over the interval 306, the microcontroller 128 will remain in an off state until the standby voltage level across the capacitor 122 is reached at time 304.

At time 304, once the voltage across the capacitor 122 exceeds the voltage standby level, the microcontroller 128 is powered on into a standby mode. The microcontroller 128 will remain in standby mode until the voltage across the capacitor 122 exceeds an active voltage level at time 308. Over the interval 310, the voltage across the capacitor 122 will continue to increase; however, due to the additional power consumed by the powered on microcontroller 128, the slope of the increasing capacitor voltage decreases.

At time 308, the CT module 101 enters current measurement mode and the microcontroller 128 enters an active mode and begins to sample the current in the CT module 101. Over the interval 312, while the microcontroller 128 is sampling current, the CT module 101 is no longer in energy harvest mode and as a result, the voltage across the capacitor 122 declines.

At time 314, once the microcontroller 128 has determined that a sufficient number of current samples have been taken, the microcontroller 128 enters a transmit/receive mode, activates the antenna 132 and begins communicating with the communication module 103. Over the interval 316, while the microcontroller 128 is in the transmit/receive mode, the voltage across the capacitor 122 will continue to decrease. However, due to the high level of power required to transmit and receive information via the antenna 132 over interval 316, the voltage across the capacitor 122 will decrease at a greater rate as compared to the rate of decrease when the microcontroller 128 is not transmitting or receiving.

At time 318, when the microcontroller 128 has finished communicating with the communication module 103 and current is still being provided to the load, the microcontroller 128 will reenter standby mode and energy will again be stored in the capacitor 122. From time 318 to time 320, the voltage across the capacitor 122 will increase.

At time 320, current is no longer provided to the load. As a result, the voltage across the capacitor 122 begins to decrease. Over the interval 321, because the voltage across the capacitor is below the standby voltage level, the microcontroller 128 will remain in standby mode. At time 322, as long as the load remains unpowered, the voltage across the capacitor 122 will fall below a microcontroller 128 power off level and the microcontroller 128 will power down into an off state. At time 322, if the load begins to receive current again, the voltage across the capacitor 122 may again start to increase.

As discussed previously, it may be required for the microcontroller 128 to be a low power controller (i.e. a microwatt controller) to operate with low currents. However, a situation may arise in which the current in the circuit branch 102 (and consequently the CT module 101) is so low that not enough voltage is across the capacitor to allow the microcontroller 128 to enter the transmit/receive mode or even stay in the active mode long enough to sample the current adequately. To accommodate low current situations, in one embodiment, the CT module 101 is capable of operating in a low power mode.

Figure 4:
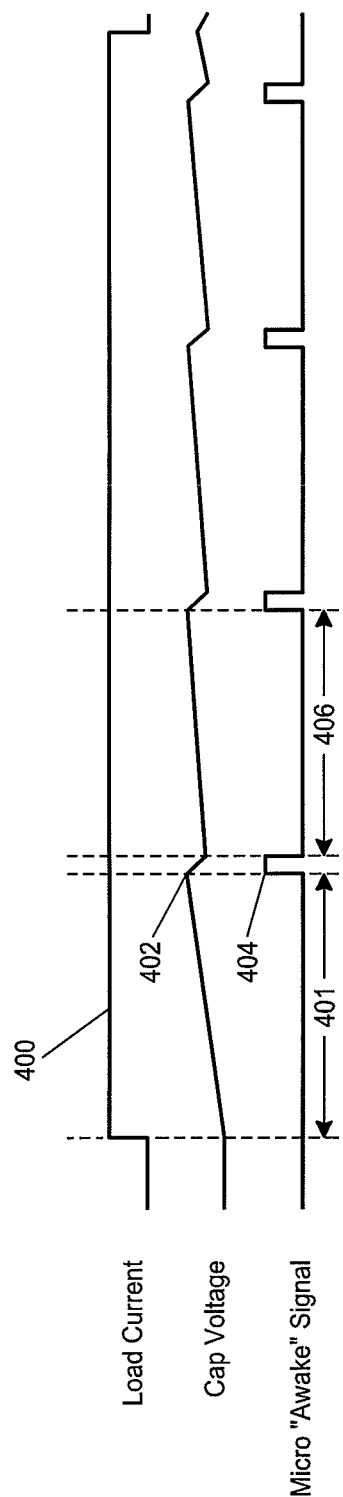
FIG. 4 is a diagram illustrating one example of the low power operation of the CT based system of FIG. 1, in accordance with aspects of the present invention.

FIG. 4 is a diagram representing the low power operation of the CT module 101 illustrated in FIG. 1, according to one embodiment of the current invention. In FIG. 4, the load current, capacitor voltage and micro "awake" signal are represented.

In the low power mode of the CT module 101, the current 400 in the circuit branch 102 (and the CT module 101) is too small to adequately power and sustain the active and transmit/receive modes of the microcontroller 128. However, the microcontroller 128 may enter standby mode as previously described and store energy in the capacitor 122 (i.e. over interval 401). Once the voltage across the capacitor 122 reaches a level 402 capable of supporting the microcontroller's 128 transition from standby mode to active mode, the microcontroller 128 will enter the active mode and turn the antenna 132 on, just long enough to send a uni-directional signal or pulse 404 to the communication module 103 to indicate that it is "awake" Immediately following the transmission of the uni-directional signal 404, the microcontroller 128 turns off the antenna 132 and exits the active mode to allow the CT module 101 to revert to the energy harvest mode and recharge the capacitor 122 (i.e. over interval 406). The microcontroller 136 of the communication module measures the interval 406 between such "awake" signals to estimate the current of the load. In such a low power mode, the current measurement may be a less accurate average load current and by not providing for the bi-directional exchange of information between the CT module 101 and the communication module 103, additional current calculations (i.e. true power, power factor and RMS current) by the microcontroller 128 are not performed.

Figure 5:
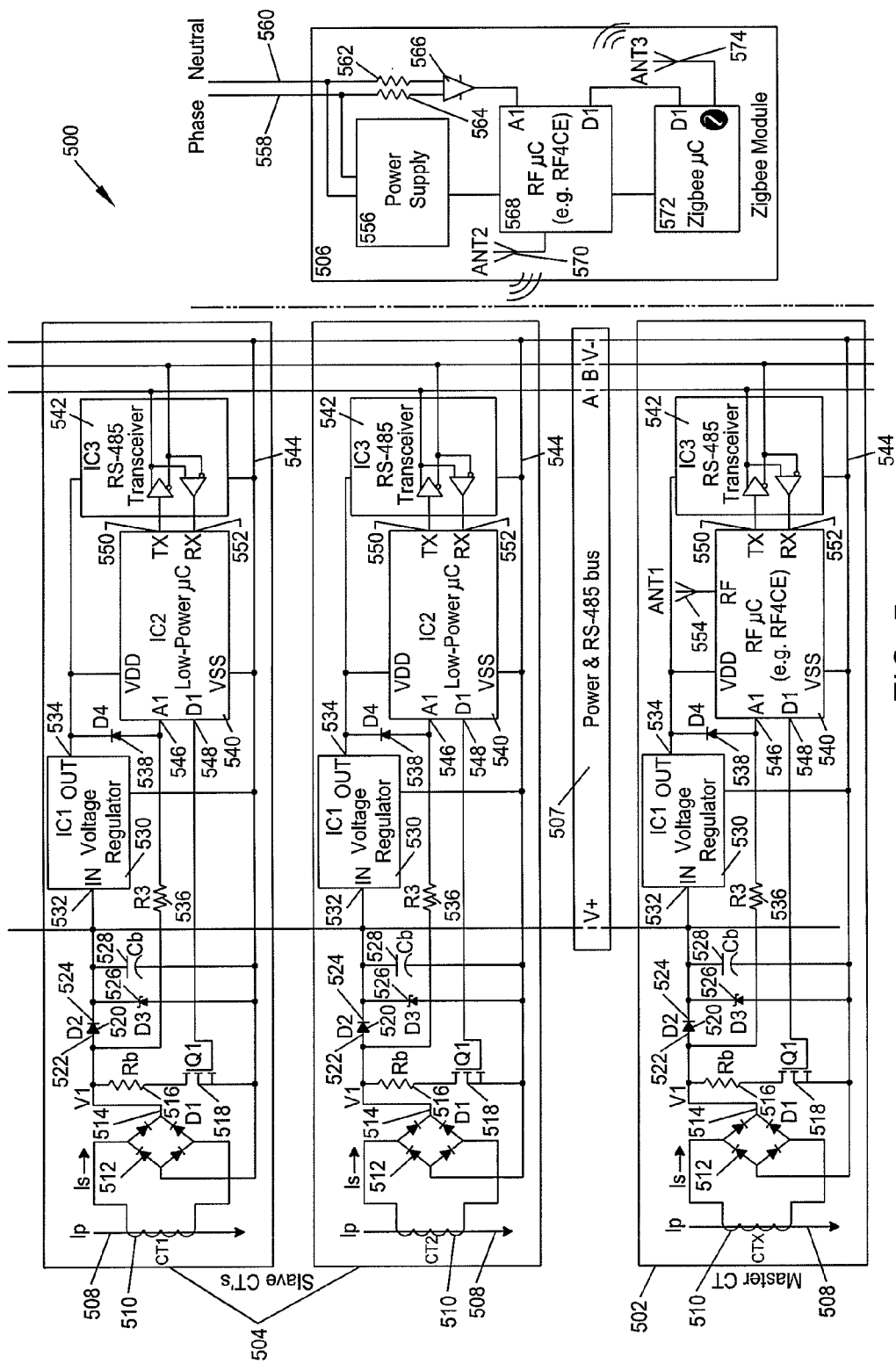
FIG. 5 is a circuit diagram of another example of a CT based system in accordance with aspects of the present invention.

According to another embodiment of the present invention, it may be possible to daisy chain a plurality of CT modules together. FIG. 5 illustrates a CT system 500 according to one embodiment of the present invention in which a plurality of CT modules are daisy chained together.

According to one embodiment, the plurality of CT modules includes a master CT module 502 and a plurality of CT slave modules 504. It should be appreciated that the plurality of CT slave modules 504 may include any number of CT slave modules. The system 500 also includes a communication module 506 and a power and information bus 507.

In one embodiment, both the master CT module 502 and the plurality of slave modules 504 include a CT 510, a rectifier 512 having an output 514, a burden resistor 516, a transistor 518, a first diode 520 having a cathode 522 and an anode 524, a Zener diode 526, a capacitor 528, a voltage regulator 530 having an input 532 and an output 534, a resistor 536, a second diode 538, a microcontroller 540, a transceiver 542, and a ground connection 544.

According to one embodiment, the microcontrollers 540 in the master CT module 502 and the slave CT modules 504 include an input 546, a control line 548, a transmit line 550, and a receive line 552. According to one embodiment the microcontroller 540 in the master CT module 502 includes an antenna 554. In one embodiment, the antenna 554 is an RF antenna. Also, in one embodiment, the communication module 506 includes a power supply 556, an input phase line 558, an input neutral line 560, a first resistor 562, a second resistor 564, an amplifier 566, a microcontroller 568, a first antenna 570, a wireless communication circuit 572, and a second antenna 574. According to one embodiment, the first antenna 570 and the second antenna 574 may be RF antennas. In one embodiment, the wireless communication circuit 572 is a Zigbee microcontroller.

According to one embodiment, in both the master CT module 502 and the slave CT modules 504, the CT 510 is electrically coupled to a subsidiary circuit branch 508 of a load center. The rectifier 512 is coupled to the CT 510 and to the ground connection 544. The burden resistor 516 is coupled between the output 514 of the rectifier 512 and the transistor 518. The transistor 518 is selectively coupled between the burden resistor 516 and the ground connection 544. The control line 548 of the microcontroller 540 is coupled to the transistor 518. The resistor 536 is coupled between the output 514 of the rectifier 512 and the input 546 of the microcontroller 540. The anode 522 of the first diode 520 is coupled to the output 514 of the rectifier 512. The cathode 524 of the first diode 520 is coupled to the input 532 of the voltage regulator 530. The Zener diode 526 is coupled between the cathode 524 of the first diode 520 and the ground connection 544. The capacitor 528 is coupled between the input 532 of the voltage regulator 530 and the ground connection 544. The output 534 of the voltage regulator 530 is coupled to the microcontroller 540 and the transceiver 542. The second diode 538 is coupled between the input 546 of the microcontroller 540 and the output 534 of the voltage regulator 530. The antenna 544 is coupled to the microcontroller 540 of the master CT module 502. The transmit line 550 of the microcontroller 540 is coupled to the transceiver 542. The receive line 552 of the microcontroller 540 is coupled to the transceiver 542. The transceiver 542 is coupled to the power and information bus 507. The power and information bus 507 is also coupled to the capacitor 528.

According to one embodiment, in the communication module 506, the phase input line 558 and the neutral input line 560 are coupled to a circuit branch (not shown). The phase input line 558 is coupled to the amplifier 566 via the second resistor 564. The neutral input line 560 is coupled to the amplifier 566 via the first resistor 562. The amplifier 566 is coupled between the resistors 558, 560 and the microcontroller 568. The power supply 556 is coupled between the phase and neutral input lines 558, 560 and the microcontroller 568. The antenna 570 is coupled to the microcontroller 568. The wireless communication circuit 572 is coupled to the microcontroller 568. The second antenna 574 is coupled to the wireless communication circuit 572.

In one embodiment, the master CT module 502 and the slave CT modules 504 are located within a load center (not shown) while the communication module 506 is located externally from the load center. For example, according to one embodiment where the load center is part of a residential energy management system and is coupled to a main power line of the residence, the master CT module 502 and the slave CT modules 504 may be located within the load center or panelboard of the residence, each coupled to a circuit branch of the load center, while the communication module 506 is located somewhere else in the residence, coupled to a circuit branch. It should be appreciated that even though each of the CT modules 502, 504 is described herein as coupled to a circuit branch within the load center, each of the CT modules 502, 504 may be coupled to a circuit branch outside of the load center. It also should be appreciated that even though the system 500 is described herein in relation to a residential energy management system, the system 500 may be utilized with any type of energy management system.

According to one embodiment, the communication module 506 receives power from the main power line (not shown) of the residence via the circuit branch (not shown) and the phase and neutral input lines 558, 560. The microcontroller 568 is coupled to the phase and neutral input line 558, 560 via the amplifier 566, and the microcontroller 568 calculates the voltage, phase and frequency information of the power line and wirelessly broadcasts the information to the master CT module 502 via the first antenna 570. The microcontroller 568 may broadcast the voltage, phase and frequency information to the master CT module 502 periodically or at any other desired time. According to one embodiment, communication between the master CT module 502 and the communication module 506 may be performed in compliance with a wireless standard such as the ZigBee RF4CE standard or the IEEE 802.15 standard. It should be appreciated that even though communication between the master CT module 502 and the communication module 506 is described herein as through a wireless medium, the communication between modules 502, 506 may be accomplished via a wired interface.

The power supply 556 provides power to the components of the communication module 506. The wireless communication circuit 572 is configured to control the wireless communication of information between the communication module 506 and another device. For example, the current and power information received by the communication module 506 is reported wirelessly, via the second antenna 574, to an energy management gateway in another device such as a computer, television, or mobile phone.

According to one embodiment, a master or slave CT module 101 is capable of operating in two modes: an energy harvesting mode and a current measurement mode. In one embodiment, while in the energy harvesting mode, AC power from the main power line (not shown) is provided to the subsidiary circuit branches 508 to power the corresponding loads. Consequently, proportionate AC current is induced in the CT 510. AC current in the CT 510 is converted by the rectifiers 512 to DC current and the DC current is stored in the capacitors 528, via the forward-biased first diode 520.

However, it should be appreciated that, because the capacitors 528 of each slave and master CT module 502, 504 are coupled together via the power and information bus 507, each slave and master CT module 502, 504 is able to store energy on all of the capacitors 528 joined together over the power and information bus 507. For example, when a slave or master CT module 502, 504 is powered and in energy harvest mode, energy harvested in one slave or master CT module 502, 504 is stored in all of the capacitors 528 coupled to the bus 507. Thus, as long as at least one of the slave or master CT modules is able to provide power to the power and information bus, all of the capacitors 528 store energy.

Therefore, even if the circuit branch 508 coupled to one of the slave or master CT modules 502, 504 is unpowered, the capacitor 528 within the corresponding unpowered CT module still stores energy received from other powered branches 508 and CT modules 502, 504 via the power and information bus 507. Similarly, if a slave or master CT module 502, 504 requires more power than is able to be provided by its capacitor 528 (i.e. to power a microcontroller 540), the remaining required energy is drawn, via the power and information bus 507, from other capacitors 528. In this way, more energy is made available to power the different slave and master CT modules 502, 504. Also, because the total amount of energy available to power the microcontrollers 540 is greater, the need for low power microcontrollers (i.e. microwatt controllers) to handle low powered signals in the slave and master CT modules 502, 504 is diminished. According to one embodiment, instead of including an individual capacitor 528 in each slave or master CT module 502, 504, one large capacitor, coupled to all of the CT modules 502, 504 via the power and information bus 507, may be used.

When the voltage stored across the capacitors 528 reaches a sufficient level, slave CT modules 504 capable of being powered on are powered on into a default standby mode. While energy continues to be stored in the capacitors 528, the voltage regulator 530 in the master CT module 502 monitors the total voltage level across the capacitors 528 via the power and information bus 507. Based on the monitored voltage level, the master CT module 502 determines which microcontrollers 540 are capable of being powered into an active mode. Upon determining which microcontrollers 540 are capable of being powered into an active mode, the master CT module 502 operates the corresponding voltage regulators 530 to power the desired microcontrollers 540 into an active mode. It should be appreciated that any number of microcontrollers 540 may be powered on and/or be in an active mode at the same time.

Once in the active mode, a microcontroller's 540 corresponding CT module 502, 504 enters the current measurement mode. Upon entering the current measurement mode, the microcontroller 540 sends a signal, via the control line 548, to the transistor 518 to power on the transistor and couple the burden resistor 516 to the ground connection 544. Once the burden resistor is coupled to the ground connection 544, the first diode 520 becomes reverse biased, preventing current between the rectifier 512 and the voltage regulator 530. Instead, current from the rectifier 512 passes to the input 546 via the resistor 536 and the microcontroller 540, powered by energy from the capacitor 528 via the voltage regulator 530, samples the current. In one embodiment, the microcontroller 540 is configured to sample the current periodically. In another embodiment, the microcontroller 540 is configured to sample the current upon request.

It should be appreciated that even though current is prevented between the rectifier 512 and the voltage regulator 530 in current measurement mode, additional energy may still be provided to the voltage regulator 530 (and consequently the microcontroller 540) from other capacitors 528 via the power and information bus 507, as discussed above.

Upon taking a sufficient number of current samples, the microcontroller 540 enters a transmit/receive mode. Once in transmit/receive mode, the microcontroller 540 in the master CT module 502 begins to receive the voltage, phase and frequency information from the communication module 506 via the antenna 554. It also should be appreciated that because the CT modules 502, 504 and the communication module 506 all receive power from circuit branches coupled to the main power line; the voltage, phase and frequency of the signals received by the microcontroller 568 of the communication module 506 via the phase and neutral lines 558, 560 will be relatively the same as the voltage, phase and frequency of the circuit branch 508 coupled to each CT module 502. 504. Hence, by calculating the voltage, phase and frequency information of the signals received by the microcontroller 568 of the communication module 506, the voltage, phase and frequency information of the circuit branch 508 may be determined.

Upon receiving the voltage, phase and frequency information via the antenna 554, the master CT module 502 passes the information to the transceiver 542 of the master CT module 502 via the transmit line 550. The transceiver 542 of the master CT module 502 transmits the information to the slave CT modules 504 via the power and information bus 507. The transceivers 542 of the slave CT modules 504 receive the voltage, phase and frequency information from the power and information bus 507 and pass the information to the microcontrollers 540 of the slave CT modules 504 via the receive line 552.

According to one embodiment, in addition to sampling current, the microcontrollers 540 also calculate additional information about the circuit branches 508 (i.e. true power, power factor and RMS current) using the current sample and the voltage, phase and frequency information received from the communication module 506. For example, in one embodiment, a microcontroller 540 uses the phase information received from the communication module 506 to "timestamp" current samples so that the accurate true power, power factor and RMS current in the circuit branch 508 can be calculated.

According to one embodiment, the microcontrollers 540 convert the current samples and/or any additional current and power information into digital data. Also, according to another embodiment, the microcontrollers 540 of the slave CT modules 504 pass the current and power information on to the transceivers 542 via the transmit lines 550. The transceivers 542 of the slave CT modules 504 transmit the current and power information to the master CT module 502 via the power and information bus 507. The transceiver 542 of the master CT module 502 passes along the current and power information to the microcontroller 540 of the master CT module 502 via the receive line 552.

In one embodiment, once a sufficient number of current samples have been taken, the sampled and calculated current and power information from all of the operating master and slave CT modules 502, 504, is transmitted, via the antenna 554 to the communication module 506 or to some other energy management system. Upon receiving the current and power information, the wireless communication circuit 572 may further transmit the information to another energy management system (i.e. a Zigbee Home Energy management Gateway).

It should be appreciated that even though the communication module 506 is described herein as external from the load center, the communication module 506 may be located within the same load center as the master and slave CT modules 502, 504. In such a situation where the communication, master and slave CT modules 502, 504, 506 are located within the same load center, the need for self-powering the master and slave CT modules 502, 504 may be eliminated as the power received by the communication module 506 via the phase and neutral lines 558, 560 can directly power the entire system 500.

It should be appreciated that by eliminating the need for internal power supplies to power the slave and master CT modules 502, 504, allowing the wireless bi-directional exchange of information between the master CT module 502 and the communication module 506, and sharing information between the master CT module 502 and the slave CT modules 504, the size and complexity of the self-powered, wireless CT system may be reduced. Also, because there is no need to directly tap into the voltage within the load center, regulatory requirements may be more easily met. Additionally, by daisy chaining CT modules together and coupling the capacitors 528 together, useful energy harvesting and current measurement may be performed even when current in any individual transformer is very low or intermittent.

It should also be appreciated that even though examples in accordance with the present invention are described herein in reference to a load center, other examples may be utilized within any electrical system in which current and power of a power line are desired to be monitored.

Aspects and examples of methods and systems for monitoring a load center for current and power usage have been described. As discussed above, by utilizing a self-powered wireless CT system, a relatively small, less complex and more manageable method and system for utilizing CT's to monitor circuit branches of a load center is provided. Having thus described several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A system for monitoring a plurality of circuit branches coupled to a power line, the system comprising:
  a communications bus; and
  a plurality of first modules, each first module comprising:
    a Current Transformer (CT) configured to be coupled to at least one of the plurality of circuit branches and to produce a reference signal having a level related to a current level of the at least one of the plurality of circuit branches;
    a rectifier coupled to the CT and configured to produce a rectified reference signal;
    a capacitor coupled to the rectifier and coupled in parallel to the capacitor of each other one of the plurality of first modules; and
    a first microcontroller coupled to the capacitor, the rectifier and the communications bus,
  wherein, the capacitor within each one of the plurality of first modules is configured to receive the rectified reference signal from each other one of the plurality of first modules and to store energy from the rectified reference signals received from the rectifier and each other one of the plurality of first modules, and
  wherein, the first microcontroller within each one of the plurality of first modules is configured to be powered by the energy stored in the capacitor and to sample the rectified reference signal from the rectifier to determine the current level of the at least one of the plurality of circuit branches.

2. The system of claim 1, further comprising:
  a second module comprising:
    a first input configured to be coupled to at least one of the plurality of circuit branches; and
    a second microcontroller coupled to the first input and configured to measure at least one of voltage, phase and frequency of the at least one of the plurality of circuit branches coupled to the first input and transmit the at least one of the voltage, the phase and the frequency to the first microcontroller of a first one of the plurality of first modules.

3. The system of claim 2, wherein the first microcontroller of the first one of the plurality of first modules is configured to receive the at least one of the voltage, the phase, and the frequency, and calculate a power level of the at least one of the plurality of circuit branches coupled to the CT of the first one of the plurality of first modules using at least one sample of the rectified reference signal and the received at least one of the voltage, the phase and the frequency and transmit the received voltage to the first microcontroller of each other one of the plurality of first modules via the communication bus.

4. The system of claim 3, wherein the second module is contained in a separate housing from the plurality of first modules.

5. The system of claim 4, further comprising a first antenna coupled to the first microcontroller of the first one of the plurality of first modules and a second antenna coupled to the second microcontroller, and wherein the second antenna is configured to broadcast the at least one of the voltage, the phase and the frequency of the at least one of the plurality of circuit branches coupled to the first input to the first antenna.

6. The system of claim 5, wherein the first antenna is configured to broadcast the calculated power level and the current level of the at least one of the plurality of circuit branches to the second antenna.

7. The system of claim 1, wherein the plurality of first modules includes a plurality of daisy chained first modules.

8. A method for monitoring a plurality of circuit branches within a load center, the plurality of circuit branches coupled to a power line, the method comprising:
coupling each one of a plurality of first modules to a communications bus;
coupling a Current Transformer (CT) within each one of the plurality of first modules to at least one of the plurality of circuit branches within the load center and producing, each one of the plurality of first modules, a reference signal having a level related to a current level of the at least one of the plurality of circuit branches;
coupling a capacitor of a first one of the plurality of first modules to a capacitor of each other one of the plurality of first modules;
receiving, with the capacitor of the first one of the plurality of first modules, the reference signal from each other one of the plurality of first modules;
storing, in the capacitor within the first one of the plurality of first modules, energy from the reference signal of the first one of the plurality of first modules and from the reference signal received from each other one of the plurality of first modules;
determining if voltage across the capacitor exceeds a first threshold;
in response to a determination that the voltage across the capacitor exceeds the first threshold, powering a microcontroller within the first one of the plurality of first modules using energy stored in the capacitor; and
sampling the reference signal from the first one of the plurality of first modules, by the microcontroller, to determine the current level of at least one of the plurality of circuit branches.

9. The method of claim 8, further comprising:
monitoring, by a second module coupled to the power line, at least one of voltage, phase and frequency of the power line; and
transmitting the at least one of the voltage, the phase and the frequency to the microcontroller of the first one of the plurality of first modules.

10. The method of claim 9, further comprising receiving, by the first one of the plurality of first modules, the at least one of the voltage, the phase, and the frequency transmitted by the second module, calculating a power level of the at least one of the plurality of circuit branches coupled to the CT of the first one of the plurality of first modules using at least one sample of the reference signal and the received at least one of the voltage, the phase and the frequency and transmitting the received voltage to the microcontroller of each other one of the plurality of first modules via the communication bus.

11. The method of claim 9, wherein the act of transmitting includes transmitting the at least one of the voltage, the phase and the frequency through an antenna.

12. The method of claim 9, further comprising transmitting the calculated power level of the at least one of the plurality of circuit branches from the first one of the plurality of first modules to the second module through an antenna.

13. The method of claim 9, further comprising:
determining if voltage across the capacitor is less than a second threshold; and
entering, in response to a determination that the voltage across the capacitor is less than the second threshold, a low power mode.

14. The method of claim 13, wherein entering a low power mode comprises:
periodically transmitting, from the at least one of the plurality of first modules to the second module, a series of pulses,
wherein an interval between pulses is based on the current level of the at least one of the plurality of circuit branches; and
measuring, by the second module, the interval between pulses and estimating the current of the at least one of the plurality of circuit branches.

15. A system for monitoring a plurality of circuit branches coupled to a power line, the system comprising:
a communications bus; and
a plurality of first modules, each first module comprising:
a Current Transformer (CT) configured to be coupled to at least one of the plurality of circuit branches and to produce a reference signal having a level related to a current level of the at least one of the plurality of circuit branches; and
means for coupling each one of the plurality of first modules together in parallel, receiving a signal related to the reference signal from each one of the plurality of first modules, storing energy from the reference signal from each one of the plurality of first modules, and for powering, with the stored energy, a microcontroller coupled to the communications bus to sample the reference signal to determine the current level of the at least one of the plurality of circuit branches.

16. The system of claim 15, further comprising:
a second module comprising:
means for measuring at least one of voltage, phase and frequency of the power line and for transmitting the at least one of the voltage, the phase and the frequency to the microcontroller of a first one of the plurality of first modules.

17. The system of claim 16, further comprising:
means for receiving, by the first one of the plurality of first modules, the at least one of the voltage, the phase, and the frequency transmitted by the second module, for calculating the power level of the at least one of the plurality of circuit branches using at least one sample of the rectified reference signal and the received at least one of the voltage, the phase and the frequency, and for transmitting the calculated power level and the current level of the at least one of the plurality of circuit branches to the second module.

18. The system of claim 17, wherein the second module is contained in a separate housing from the plurality of first modules.

19. The system of claim 15, wherein the plurality of first modules includes a plurality of daisy chained first modules, each having means for storing energy.

* * * * *